United States Patent [19]

Paoli et al.

[11] Patent Number: 5,641,704
[45] Date of Patent: Jun. 24, 1997

[54] METHOD OF ISOLATING ACTIVE AREAS OF A SEMICONDUCTOR SUBSTRATE BY SHALLOW TRENCHES AND NARROW TRENCHES

[75] Inventors: Maryse Paoli, Villard-Bonot; Pierre Brouquet, Crolles; Michel Haond, Meylan, all of France

[73] Assignee: France Telecom, Paris, France

[21] Appl. No.: 403,143

[22] Filed: Mar. 13, 1995

[30] Foreign Application Priority Data

Mar. 11, 1994 [FR] France ................... 94 02870

[51] Int. Cl.[6] ............................................. H01L 21/306
[52] U.S. Cl. ................... 438/436; 148/DIG. 133; 438/427; 438/437
[58] Field of Search .............. 437/62, 67; 148/DIG. 133, 148/50, 43, 85, 86; 156/653.1

[56] References Cited

U.S. PATENT DOCUMENTS

| | | | |
|---|---|---|---|
| 4,506,435 | 3/1985 | Pliskin et al. | 29/576 W |
| 4,543,706 | 10/1985 | Bencuya et al. | 29/571 |
| 4,571,819 | 2/1986 | Rogers et al. | 29/576 |
| 4,952,524 | 8/1990 | Lee et al. | 437/67 |
| 5,229,317 | 7/1993 | Nishio | 437/67 |
| 5,275,965 | 1/1994 | Manning | 437/67 |
| 5,387,539 | 2/1995 | Yang et al. | 437/67 |
| 5,472,904 | 12/1995 | Figura et al. | 437/67 |
| 5,492,858 | 2/1996 | Bose et al. | 437/67 |

FOREIGN PATENT DOCUMENTS

| | | |
|---|---|---|
| 0 300569 | 1/1989 | European Pat. Off. . |
| 0 461498 | 12/1991 | European Pat. Off. . |
| 0216261 | 9/1987 | Japan .................. 437/67 |
| 0252050 | 11/1987 | Japan .................. 437/67 |

OTHER PUBLICATIONS

Patent Abstracts of Japan, vol. 9, No. 39 (E-297) (1762) 19 Fevrier 1985.
Patent Abstracts of Japan, vol. 18, No. 105 (E-1512) 21 Fevrier 1994 & JP-A-05 304 219.
IEEE Transactions On Electron Devices, vol. ED-34, No. 12, Dec. 1987, New York, US.

*Primary Examiner*—John Niebling
*Assistant Examiner*—Long Pham
*Attorney, Agent, or Firm*—Robbins, Berliner & Carson, LLP

[57] ABSTRACT

The semiconductor device includes in a semiconductor substrate (1) at least one predetermined region (6) of the substrate intended subsequently to form an active area, uncovered on its upper surface and situated between lateral trenches (7) containing an insulative material including a layer (9) of a planarising first oxide and at least one underlying layer (8) of a conformal second oxide. The insulative material can form on either side of said uncovered predetermined region (6) of the substrate a boss (16) on the plane upper surface of the device (D) less than 1000 Å high.

14 Claims, 4 Drawing Sheets

METHOD OF ISOLATING ACTIVE AREAS OF A SEMICONDUCTOR SUBSTRATE BY SHALLOW TRENCHES AND NARROW TRENCHES

BACKGROUND OF THE INVENTION

1. Field of the Invention

The invention concerns lateral isolation of active areas of a semiconductor substrate by shallow trenches.

2. Description of the Related Art

Lateral isolation techniques are evolving against a background of reducing dimensions and increasing density in the field of microelectronics. The person skilled in the art already knows techniques based on localised oxidation ("LOCOS"). In a technique of this kind, oxide is grown by a thermal process in an opening intended to form the isolating structure. However, the person skilled in the art also knows that a structure of this kind spreads laterally in a so-called "beak" shape causing widening of the isolation area and shrinking of the active area. At present the length of the beak can be reduced by a large number of technical operations. Nevertheless, this technique is subject to limitations which cannot be overcome at present because the technique leads to thinning of the insulative oxide in narrow openings.

The person skilled in the art knows different isolation techniques which consists in filling shallow trenches with an insulative material. The person skilled in the art usually calls this technique the "BOX" technique or "Shallow Trench Isolation (STI)". This technique has been the subject of considerable research and many publications over a number of years and has to date been developed to only a very limited extent because of its technological complexity.

SUMMARY OF THE INVENTION

An object of the invention is to propose isolation of active areas of semiconductor substrates by lateral trenches providing good electrical insulation combined with good filling of the trenches, especially in the case of particularly narrow trenches which can have a depth/width ratio greater than 1, with a width in the order of 0.4 µm or even less, for example 0.2 µm.

In accordance with one general feature of the method in accordance with the invention of isolating active areas of a semiconductor substrate by means of lateral trenches:

a) trenches are formed in the semiconductor substrate laterally of predetermined regions of the substrate which subsequently form said active areas, b) a layered structure is deposited in the trenches and on said predetermined regions of the substrate, comprising a layer of a planarising insulative first oxide between two layers of a conformal second oxide, c) the semiconductor block formed in step b) is annealed, and d) the annealed semiconductor block is planarised to uncover the upper surface of said predetermined regions of the substrate and to leave in the isolating trenches the conformal oxide and the planarising oxide.

In one embodiment of the method of the invention, in step b), to form said layered structure, there are deposited a first conformal oxide layer having a thickness chosen according to the minimal lateral dimension of the trenches, then the planarising oxide layer having a thickness chosen to obtain a relief variation less than a predetermined threshold for the trenches of minimal lateral dimension, and finally a second conformal oxide layer having a thickness chosen according to the depth of the trench.

The thickness of the first conformal oxide layer is preferably between ¼ and ⅓ the minimal lateral dimension of the trenches and said predetermined threshold is preferably in the order of 200 Å.

The thickness of the planarising oxide layer is advantageously between 1000 Å and 2000 Å.

In one embodiment of the method, in step a), before forming the trenches, an auxiliary layer is deposited on an insulative primary layer and the thickness of the second conformal oxide layer of the layered structure is greater than the sum of the thickness of said auxiliary layer and of the trench depth.

In one preferred embodiment of the invention, in the planarising step d):

d1) the annealed semiconductor block is partially and selectively etched to leave on either side of each predetermined region of the substrate or on either side of groups of neighbouring predetermined regions of the substrate projecting areas of conformal oxide, d2) the upper conformal oxide layer of the semiconductor block formed in step d1) is partially mechanically/chemically polished to reduce the height of the projecting conformal oxide areas below a chosen residual relief height, for example 1000 Å, d3) the predetermined regions of the substrate are uncovered by chemical etching with detection of end of attack on the semiconductor block formed in step d2).

End of attack is preferably detected at the auxiliary layer which accordingly serves as the barrier layer for the etching operation.

The residual relief height that the shaped projecting oxide areas must not exceed after mechanical/chemical polishing is chosen, among other things, so as not to disrupt subsequent photolithography steps prior to completion of the semiconductor component in the substrate. It has been found that a residual height of 1000 Å is an acceptable limit.

In one embodiment of the invention, in step a) the definition of the predetermined regions of the substrate includes the production of a mask and some of the projecting regions are produced using a mask corresponding to the negative of the mask defining the predetermined regions of the substrate. Nevertheless, certain other projecting regions can be produced using a mask enlarged relative to the negative of the mask defining the active areas. This applies in particular when active areas close together are separated by narrow trenches.

The use in accordance with the invention of conformal oxide and planarising oxide fills small voids, typically having a depth/width ratio in the order of 1, and this use of two oxides and in particular of the planarising oxide allows a tolerance in the alignment of the mask on the semiconductor substrate which prevents the subsequent formation of crevasses on either side of the active regions which would cause leakage currents in the finished semiconductor component.

The invention also consists in a semiconductor device including in a semiconductor substrate at least one predetermined region of the substrate intended subsequently to form an active area, uncovered on its upper surface and situated between lateral trenches containing an insulative material including a layer of a planarising first oxide and at least one underlying layer of a conformal second oxide.

In a preferred embodiment of the invention the insulative material forms on either side of said uncovered particular region of the substrate a boss on the plane upper surface of the device, the height of this boss being advantageously less than 1000 Å.

BRIEF DESCRIPTION OF THE DRAWINGS

Other advantages and features of the invention will emerge from a reading of the detailed description of embodiments of the invention given by way of non-limiting example with reference to the appended drawings in which.

DETAILED DESCRIPTION OF THE INVENTION

The embodiment of the method of the invention shown in FIGS. 1a through 1h starts with the formation on a semiconductor substrate 1, which can be of silicon, gallium arsenide or silicon on insulator, a primary layer 2 of oxide such as silicon dioxide $SiO_2$ or silicon oxynitride. This primary layer can be grown or deposited and one of its functions is to protect the substrate 1.

An auxiliary or barrier layer 3 is deposited on the primary oxide layer 2. It is of polycrystalline or amorphous silicon or silicon nitride ($Si_3N_4$), for example. As explained in more detail below, the auxiliary layer 3 advantageously serves as a barrier layer for chemical etching of higher layers, with detection of end of attack. Its thickness is between 500 Å and 2000 Å, typically 1000 Å.

As also explained below, the primary oxide layer 2 serves as a barrier layer for the etching of the auxiliary barrier layer 3. The thickness of the primary oxide layer must be sufficient for it to perform the barrier layer function but not too thick as otherwise this will impede the etching operations. A suitable thickness is between 50 Å and 500 Å.

The next step is to define predetermined regions of the substrate which will subsequently form the active areas of the finished semiconductor component. This definition step conventionally entails depositing a resin 4 which is exposed through a mask defining the active areas and then developed to yield the final structure shown in FIG. 1b.

Figure 1A:
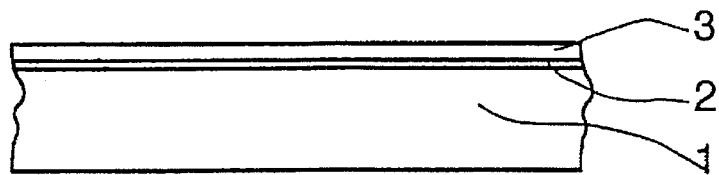
FIGS. 1a through 1i show one embodiment of the method of the invention.
Figure 1B:
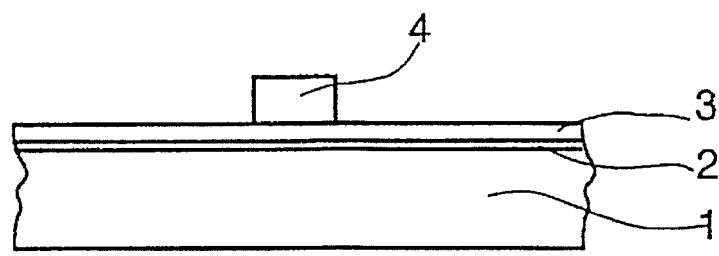
Figure 1C:
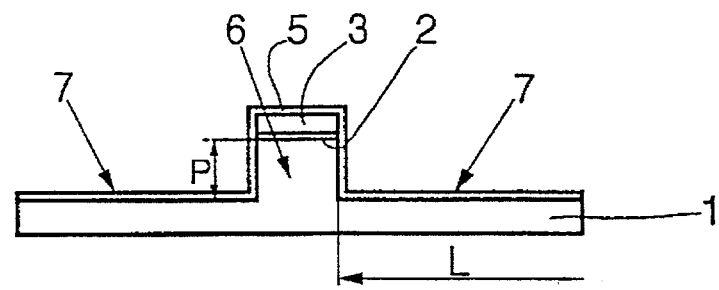

The substrate is then chemically etched on either side of the resin 4 after which the resin is removed and an additional oxide (for example silicon dioxide) layer is grown on the semiconductor block to produce a layer 5 constituting a good interface between the substrate 1 and the future isolating trench 7 and to protect the substrate 1 from impurities. FIG. 1c shows the structure obtained at this stage in the process. The predetermined region 6 of the substrate which will subsequently form the active areas of the semiconductor component has the primary oxide layer 2 and the auxiliary layer 3 on top of it. Thus the trenches 7 are formed on either side of the region 6 and are covered by the additional layer 5 of silicon dioxide.

The trenches 7 have a lateral dimension or width L and a depth P.

Figure 2A:
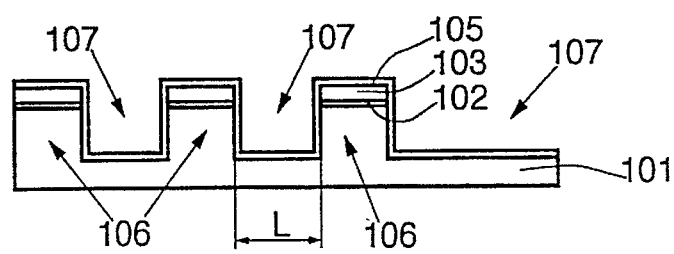
FIGS. 2a through 2f show another embodiment of the method of the invention more particularly intended for close together active areas separated by narrow trenches, and FIGS. 3a and 3b respectively show a region of substrate covered with a conformal oxide layer and with a planarising oxide layer.
Figure 2B:
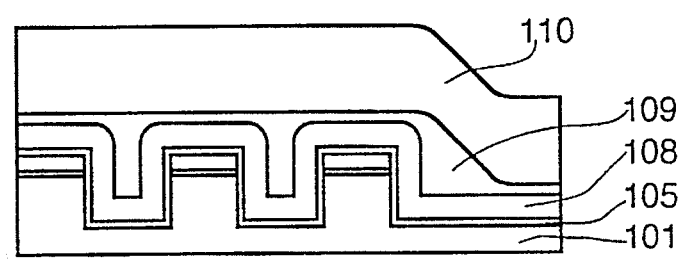

A plurality of predetermined regions which will subsequently form the active areas of one or more semiconductor components are disposed on a semiconductor material wafer. The geometrical configurations of these future active areas can be extremely varied. As shown in FIG. 1c, the active areas can be isolated or widely separated from other active areas by wide isolating trenches; alternatively, as shown in FIG. 2a, groups of active areas 106 can be separated by trenches 107 of greater or lesser width, as appropriate.

The next step of the method of the invention is to form in the trenches 7 (FIG. 1d) and on the predetermined region of the substrate (the future active area) an insulative layered structure comprising a layer 9 of a first insulative oxide or "planarising" oxide between two layers 8 and 10 of a second isolating or "conformal" oxide.

The person skilled in the art knows that a conformal oxide mates with the asperities of a substrate onto which it is deposited while a planarising oxide, which is much more fluid, fills small voids. This difference between two oxides can also be explained in terms of their surface mobility and is shown in FIGS. 3a and 3b in particular.

Figure 3A:
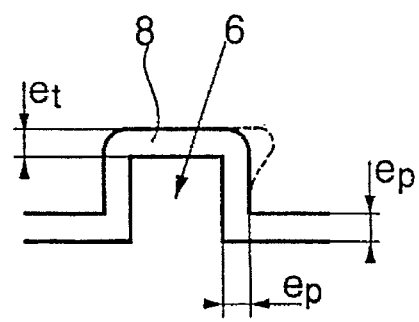

FIG. 3a shows a predetermined substrate region 6 surrounded by trenches and covered by a conformal oxide layer 8. The surface mobility of the conformal oxide is very low (virtually zero), with the result that the thickness $e_p$ of the oxide layer at the bottom of the step formed by the flank of the active area 6 is substantially equal to or even less than the thickness $e_t$ of the layer 8 at the top of the step, which produces voids in the conformal oxide when it is used to fill narrow trenches.

Figure 3B:
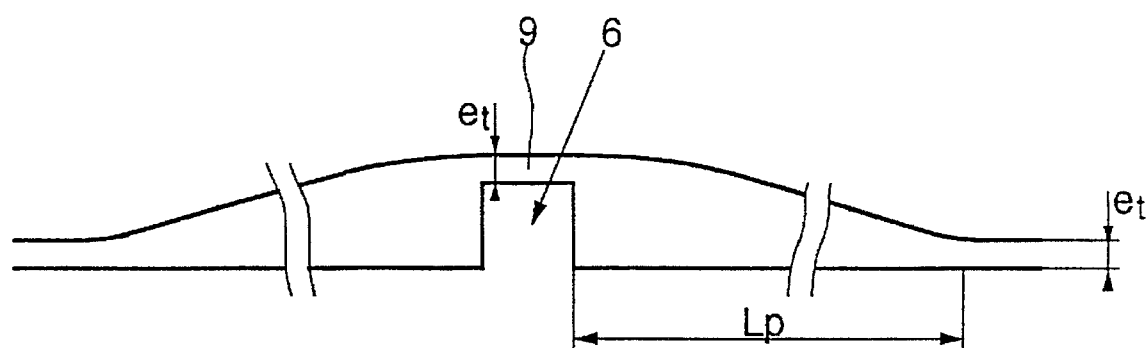

On the other hand, as shown in FIG. 3b in which the same active area 6 has been covered with a planarising oxide layer 9, this latter layer extends with a gentle slope on either side of the active area to revert over a distance to the thickness $e_t$ of the layer as measured at the top of the active area. A ratio $L_p/e_t$ greater than 1 is obtained, where $L_p$ is the distance between the flank of the active area and the location at which the thickness of the layer returns to the value $e_t$. Because of the gentle slope on either side of the active area, a planarising oxide produces a virtually plane oxide layer upper surface which is larger than the upper surface of the active area, which is advantageous when using masks as described in more detail below. The planarising oxide produced by the "Planar 200" machine marketed by the British company ELECTROTECH can be used, for example. With this planarising oxide the ratio $L_p/e_t$ obtained is in the order of 10.

The planarising oxide and the conformal oxide can be distinguished within a layered structure by cleaving the structure at an isolated active area, or even an active area relatively far from another area, and then chemically revealing the layers using a chemical solution well known to the person skilled in the art and based on hydrofluoric acid, for example, selectively etching the various layers of the layered structure, and finally using a scanning electron microscope to measure the respective thicknesses of the various layers at the bottom and at the top of the step.

With narrow trenches (having a width in the order of 0.4 μm or even less), use of conformal oxide alone could produce a P/L ratio close to 1 and lead to the formation of voids in the isolating trenches, but using planarising oxide on top of the first conformal oxide layer fills these small voids perfectly.

The thickness of the first conformal oxide layer 8 is advantageously between ¼ and ⅓, and preferably ⅓, the minimal width of the trenches formed on the semiconductor wafer as a whole. This layer 8 provides virtually all of the required electrical isolation function.

The second conformal oxide layer produces a virtually flat top on the layered structure deposited into the wide trenches and which features declivities after deposition of the planarising oxide due to this oxide flowing over these large surfaces.

The conformal and planarising oxides are of the same kind, for example silicon dioxide. The planarising oxide is preferably deposited using the ELECTROTECH Planar 200 machine, for example. The conformal oxide can be deposited by conventional chemical vapour deposition (CVD).

The thickness of the planarising oxide layer is chosen so that minimal width trenches on the wafer are perfectly filled, meaning a variation in relief of less than 200 Å. A planarising oxide layer thickness between 1000 Å and 2000 Å is considered satisfactory for trench widths L around 0.4 μm.

The thickness of the second conformal oxide layer 10 is greater than the sum of the thickness of the barrier layer 3 and the depth of the trench. The thickness of the layer 1 is made 10% greater than said sum, to cover variations in subsequent etching processes.

The final stage of the process is to anneal the semiconductor block obtained at a temperature of at least 900° C. Well known to the person skilled in the art, this annealing homogenises the deposited oxide layers, which is particularly advantageous for subsequent etching operations. Although annealing is sufficient to obtain satisfactory electrical insulation in the final semiconductor component(s), it is preferable to carry it out at a temperature in the order of 1050° as this optimises the electrical insulation of the final component(s).

Figure 1D:
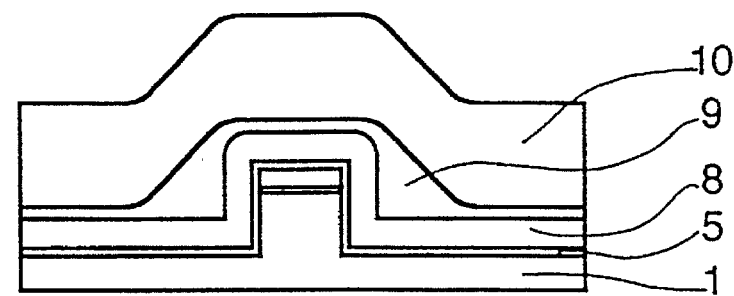

FIGS. 1e through 1i show the step of planarising the semiconductor block shown in FIG. 1d.

Although it is possible to carry out this planarising step using chemical etching of the layered structure with detection of end of attack on the auxiliary layer 3 (which is a layer of polysilicon, for example), it has been found preferable for this planarising step to include partial selective etching of the semiconductor block shown in FIG. 1d to leave on each side of each predetermined region of the substrate projecting areas 13 of conformal oxide, followed by partial mechanical/chemical polishing of the top layer of conformal oxide of the etched semiconductor block in order to reduce the height of the projecting conformal oxide areas 13 so that they are below a chosen residual relief height, followed by uncovering the predetermined region 6 of the substrate by chemical etching with detection of end of attack on the semiconductor block that has been mechanically/chemically polished.

Figure 1E:
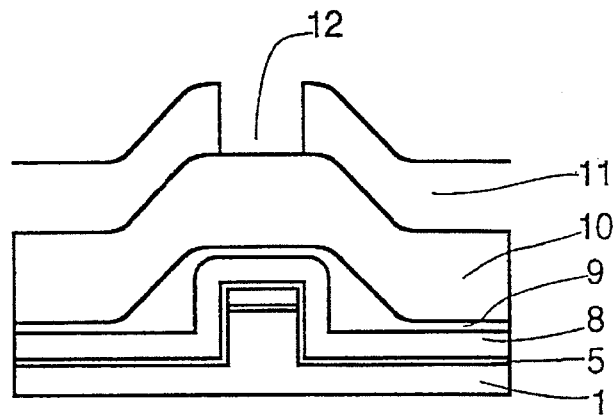

To go into more detail, the projecting regions 13 are defined by a mask corresponding to the negative of the mask defining the active area 6. The use of this mask is part of a conventional photolithography step using a resin 11 deposited onto the upper surface of the second conformal oxide layer 10. After exposure through the mask and development of the resin, the latter features a cavity 12 aligned with the active area 6 (FIG. 1e).

Note that the combined use of planarising oxide and conformal oxide produces on the upper surface of the second conformal oxide layer, on top of the active area 6, a plane surface portion sufficient to enable correct alignment of the mask with the edges of the active area of the substrate, allowing for alignment tolerances. This prevents the subsequent formation of small cavities on either side of the active area 6 of the substrate which would otherwise be produced by subsequent chemical etching on too narrow a portion of surface.

The conformal oxide layer 10 is then etched for a fixed time to remove a thickness of oxide equal to the sum of the thickness of the auxiliary layer 3 and the depth P of the trench. The resin 11 is then removed to obtain the structure shown in FIG. 1f. The upper cavity 20 in the block formed in this way is delimited laterally by the steep walls of the projecting points 13. The bottom wall of the cavity 20 is substantially at the same level as the upper surface of the block outside the points 13. The points 13 are relatively narrow at the bottom, where their width is between 0.5 μm and 1 μm, typically 0.5 μm.

Figure 1F:
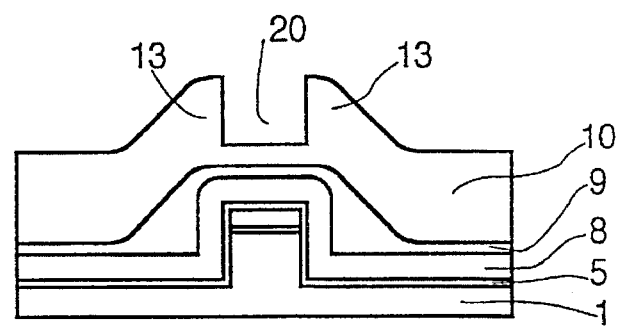
Figure 1G:
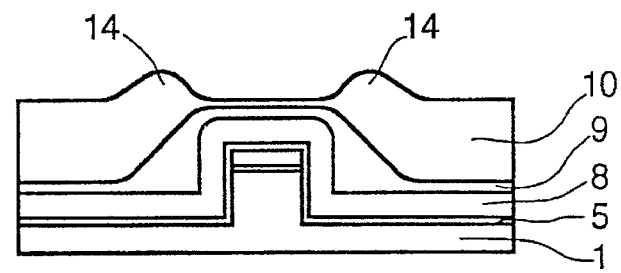
Figure 1H:
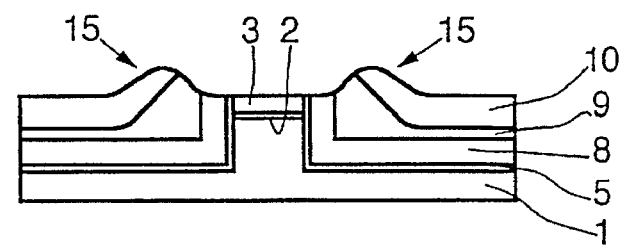

The semiconductor block shown in FIG. 1f is then partly mechanically/chemically polished to round off the projecting points 13. This polishing is carried out until the residual relief heights of the bosses 14 are typically less than 1000 Å. This upper limit of 1000 Å has been chosen to prevent problems in subsequent photolithography steps carried out on the device finally obtained by the method of the invention (FIG. 1i) to produce the finished components.

This mechanical/chemical polishing is partial in the sense that it is carried out for a period such that residual bosses remain. It has the advantage of essentially mechanical polishing of the projecting regions avoiding essentially chemical etching of large insulative areas on either side of the projecting regions. This prevents chemical excavation of these large insulative areas which could otherwise result in depressions in the plane upper surface of the semiconductor device finally obtained using the method of the invention and shown in FIG. 1i. Also, the process of the invention allows moderate use of mechanical/chemical polishing, which is a particularly difficult operation. In practice it has proved possible to obtain rounded bosses with a residual relief height of 200 Å.

The next step is chemical etching, preferably plasma etching, with detection of end of attack on the barrier layer 3. To this end the barrier layer 3 must resist plasma etching and must therefore be made of a material such that the ratio of the rate of etching the additional layer 5 of silicon dioxide to the rate of etching the material of the barrier layer is not less than ten.

Figure 1I:
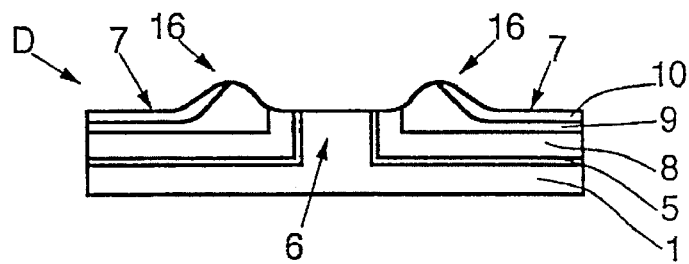

The barrier layer 3 is then etched away, for example by reactive ion etching (RIE), after which the oxide is removed from the predetermined region 6 of the substrate to obtain the final device shown in FIG. 1i. This device D therefore has the predetermined substrate region 6 uncovered on its upper surface. This region 6 will subsequently (e.g. after ion implantation) form the future active area of a semiconductor component. This future active area 6 is isolated from other active areas of the substrate by trenches 7 which in this embodiment contain a layered structure of conformal oxide 8, planarising oxide 9 and conformal oxide 10. The insulative material of the trench forms on either side of the uncovered predetermined substrate region 6 a boss 16 on the plane upper surface of the device D. The height of this boss is less than 1000 Å which means that it will not impede any subsequent photolithography steps.

The embodiment of the method of the invention just described is more particularly intended for isolated active areas, and even for active areas relatively far away from other active areas. Nevertheless, the same semiconductor substrate wafer can carry various configurations of active areas with different geometrical shapes and in particular active areas 106 separated by narrow trenches 107 having widths L of 0.5 μm, for example (FIG. 2a). FIGS. 2a through 2f show an embodiment of the method of the invention which is more particularly applicable to close together active areas like these. In these figures, parts analogous to or having analogous functions to those shown in FIGS. 1a through 1i have the same reference numbers increased by 100 relative to those used in the latter figures. Only the differences between FIGS. 1a through 1i and FIGS. 2a through 2f are described.

Figure 2C:
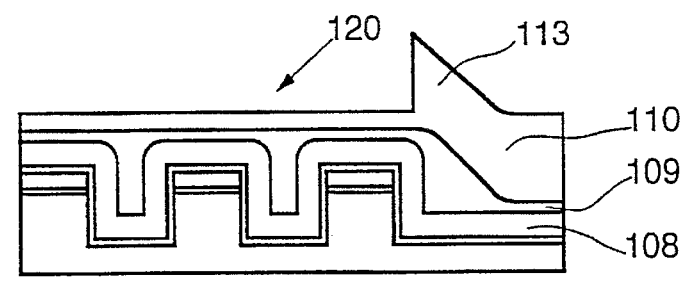
Figure 2D:
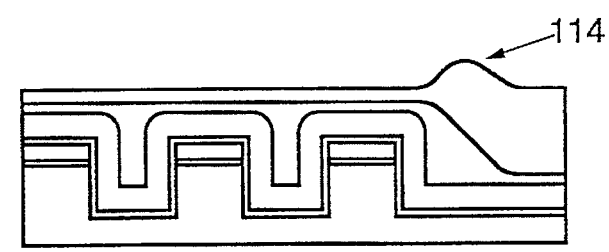
Figure 2E:
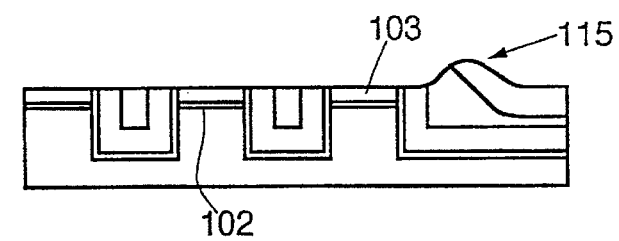

If the variations in relief measured on the upper conformal oxide layer 110 (FIG. 2b) and resulting from the filling of the narrow trenches 107 is below a predetermined limit in the order of 200 Å the narrow trenches are deemed to be perfectly filled. In this case it is not necessary to mask each narrow trench individually. The mask is then widened relative to the mask defining the active areas in order to generate the projecting points 113 on either side of the group of future active areas 106 separated by the narrow trenches. For simplicity FIG. 2c shows only one of these projecting points 113.

Figure 2F:
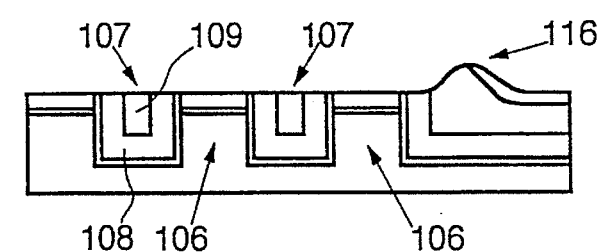

The subsequent steps of the method are identical and yield the final structure of the device D shown in FIG. 2f. The second conformal oxide layer has been completely removed in the narrow trenches 107 where there remains only one conformal oxide layer 108 under the planarising oxide layer 109.

We claim:

1. Method of isolating active areas of a semiconductor substrate with lateral trenches, comprising:
   a) trenches are formed in the semiconductor substrate laterally of first regions of the substrate which subsequently form said active areas,
   b) a layered structure is deposited in the trenches and on said first regions of the substrate, comprising a layer of a planarising insulative first oxide between two layers of a conformal second oxide to form a semiconductor block,
   c) the semiconductor block formed in step b) is annealed, and
   d) the annealed semiconductor block is planarised to uncover the upper surface of said first regions of the substrate and to leave in the trenches the conformal oxide and the planarising oxide.

2. Method of isolating active areas of a semiconductor substrate with lateral trenches, comprising:
   a) trenches are formed in the semiconductor substrate laterally of first regions of the substrate which subsequently form said active areas,
   b) a layered structure is deposited in the trenches and on said first regions of the substrate, comprising a layer of a planarising insulative first oxide between two layers of a conformal second oxide to form a semiconductor block,
   c) the semiconductor block formed in step b) is annealed, and
   d) the annealed semiconductor block is planarised to uncover the upper surface of said first regions of the substrate and to leave in the trenches the conformal oxide and the planarising oxide, wherein said trenches have a lateral dimension (L) and a depth (P) and in step b), to form said layered structure, there are deposited a first conformal oxide layer having a thickness chosen according to the minimal lateral dimension (L) of the trenches, then the planarising insulative first oxide layer having a thickness chosen to obtain a relief variation less than a first threshold for the trenches of minimal lateral dimension, and finally a second conformal oxide layer having a thickness chosen according to the depth (P) of the trench.

3. Method according to claim 2 wherein the thickness of the first conformal oxide layer is between ¼ and ⅓ the minimal lateral dimension (L) of the trenches and said first threshold is in the order of 200 Å.

4. Method according to claim 2 wherein the thickness of the planarising insulative first oxide layer is between 1000 Å and 2000 Å.

5. Method according to claim 2 wherein in step a), before forming the trenches, an auxiliary layer is deposited on an insulative primary layer and the thickness of the second conformal oxide layer of the layered structure is greater than the sum of the thickness of said auxiliary layer and of the trench depth (P).

6. Method according to claim 2 wherein the planarising step d) further comprises:
   d1) the annealed semiconductor block is partially and selectively etched to leave on either side of each first region of the substrate or on either side of groups of neighbouring second regions of substrate projecting areas of conformal oxide,
   d2) a second conformal oxide layer of the semiconductor block formed in step d1) is partially mechanically/chemically polished to reduce a height of the substrate projecting areas of conformal oxide below a chosen residual relief height,
   d3) the first and second regions of the substrate are uncovered by chemical etching with detection of end of attack on the semiconductor block formed in step d2).

7. Method according to claim 6 wherein in step a) the definition of the first regions of the substrate includes the production of a mask and some of the substrate projecting areas are produced using a mask corresponding to the negative of the mask defining the first regions of the substrate.

8. Method according to claim 6 wherein in step a) the definition of the second regions of the substrate includes the production of a mask and some of the substrate projecting areas are produced using a mask enlarged relative to the negative of the mask defining the second regions of the substrate.

9. Method according to claim 6 wherein the residual relief height is in the order of 1000 Å.

10. Method according to claim 6 wherein end of attack is detected on the auxiliary layer serving as a barrier layer for an etching operation.

11. Method according to claim 10 wherein the chemical etching with end of attack detection is plasma etching.

12. Method according to claim 5 wherein step a) further comprises the formation on the semiconductor substrate of a primary oxide layer before deposition of the auxiliary oxide layer and in that in step d) the auxiliary oxide layer and the primary oxide layer are removed after chemical etching.

13. Method according to claim 6 wherein the annealing is effected at a temperature in the order of 1050° C.

14. Method according to claim 2 wherein some of the trenches formed have a lateral dimension between 0.2 μm and 0.5 μm and a depth/lateral dimension ratio in the order of 1.

* * * * *